(12) United States Patent
Liu et al.

(10) Patent No.: US 9,887,292 B2
(45) Date of Patent: Feb. 6, 2018

(54) COLOR FILM SUBSTRATE, TOUCH DISPLAY AND METHOD FOR MANUFACTURING THE COLOR FILM SUBSTRATE

(71) Applicant: BOE TECHNOLOGY GROUP CO., LTD., Beijing (CN)

(72) Inventors: Fengjuan Liu, Beijing (CN); Longbao Xin, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/908,877

(22) PCT Filed: Aug. 20, 2015

(86) PCT No.: PCT/CN2015/087611
§ 371 (c)(1),
(2) Date: Jan. 29, 2016

(87) PCT Pub. No.: WO2016/150086
PCT Pub. Date: Sep. 29, 2016

(65) Prior Publication Data
US 2017/0040460 A1    Feb. 9, 2017

(30) Foreign Application Priority Data

Mar. 20, 2015 (CN) .......................... 2015 1 0126166

(51) Int. Cl.
*H01L 29/10* (2006.01)
*H01L 29/786* (2006.01)
*H01L 27/12* (2006.01)

(52) U.S. Cl.
CPC .... *H01L 29/78606* (2013.01); *H01L 27/1225* (2013.01); *H01L 27/1248* (2013.01); *H01L 27/1262* (2013.01); *H01L 29/7869* (2013.01)

(58) Field of Classification Search
None
See application file for complete search history.

(56) References Cited

U.S. PATENT DOCUMENTS

| 7,782,413 B2 | 8/2010 | Koike et al. |
| 2011/0147735 A1 | 6/2011 | Cheong |

(Continued)

FOREIGN PATENT DOCUMENTS

| CN | 1941299 | 8/2010 |
| CN | 102718408 A | 10/2012 |

(Continued)

OTHER PUBLICATIONS

International Search Report and Written Opinion with English Language Translation, dated Dec. 15, 2015, Application No. PCT/CN2015/087611.
Office Action in Chinese Application No. 201510126166.2 dated Mar. 30, 2017, with English translation. 9 pages.

*Primary Examiner* — Cuong Q Nguyen
*Assistant Examiner* — Nishath Yasmeen
(74) *Attorney, Agent, or Firm* — Blakely Sokoloff Taylor & Zafman LLP

(57) ABSTRACT

The present invention discloses an array substrate and a preparation method thereof, a display panel and a display device, so as to solve the problem that the performance of the oxide TFT may be reduced and even out of work due to relatively great shift of the threshold voltage of the oxide TFT since the water, oxygen and hydrogen groups may permeate to the active layer of the oxide TFT from the passivation layer above the oxide TFT. The array substrate comprises a base substrate, an oxide thin film transistor TFT formed on the base substrate, a passivation layer being arranged above the oxide TFT, the passivation layer comprises a first film layer, the first film layer being a silicon oxide film; the passivation further comprises a second film (Continued)

layer formed on the first film layer, the second film layer is an alternate stack of silicon nitride films and silicon oxide films, a base layer of the second film layer close to the first film layer is a silicon nitride film; wherein the thickness of the first film layer is greater than the thickness of the second film layer.

14 Claims, 3 Drawing Sheets

(56) References Cited

U.S. PATENT DOCUMENTS

2012/0248422 A1* 10/2012 Mine .................. H01L 51/5256
                                                              257/40
2013/0264564 A1* 10/2013 Park .................... H01L 29/7869
                                                              257/43

FOREIGN PATENT DOCUMENTS

| CN | 102969361 | 3/2013 |
| CN | 103077943 A | 5/2013 |
| CN | 103081079 | 5/2013 |
| CN | 103137496 A | 6/2013 |
| CN | 104752441 | 7/2015 |
| CN | 204464279 | 7/2015 |
| WO | WO 2014149682 A1 | 9/2014 |

* cited by examiner

COLOR FILM SUBSTRATE, TOUCH DISPLAY AND METHOD FOR MANUFACTURING THE COLOR FILM SUBSTRATE

FIELD

This disclosure relates to the field of display technology, particularly to an array substrate and a preparation method thereof, a display panel and a display device.

BACKGROUND

The thin film transistor (TFT) adopts a metal oxide semiconductor as the active layer and has the advantages of ultrathin, light in weight, low power consumption etc. Compared with the amorphous silicon TFT, the concentration of carriers of the oxide TFT is ten times of the amorphous silicon TFT. Moreover, the oxide TFT also has the advantages of good uniformity, transparency and simple fabricating process and so on; when it is applied in the array substrate of a display panel, it can meet the requirements of the liquid crystal display (LCD) panel and the organic light emitting diode (OLED) display panel perfectly.

However, the existing array substrate applying the oxide TFT also has the following problems:

Since the water, oxygen and hydrogen groups may permeate to the active layer of the oxide TFT from the passivation layer above the oxide TFT, and cause the threshold voltage of the oxide TFT to shift greatly, thereby influencing the performance of the oxide TFT and even resulting in failure of the product. Hence, the stability and reliability of the array substrate using the oxide TFT need to be improved further.

SUMMARY

The object of this disclosure is providing an array substrate and a preparation method thereof, a display panel and a display device, which can at least partly mitigate and eliminate the problems existing in the prior art.

According to a first aspect of this disclosure, an array substrate is provided, comprising a base substrate, an oxide thin film transistor TFT formed on the base substrate, a passivation layer being arranged above the oxide TFT, wherein the passivation layer comprises a first film layer, and the first film layer is a silicon oxide film;

the passivation layer further comprises a second film layer formed on the first film layer, the second film layer is an alternate stack of silicon nitride films and silicon oxide films, a base layer of the second film layer close to the first film layer is a silicon nitride film;

wherein the thickness of the first film layer is greater than the thickness of the second film layer.

In this embodiment, the first film layer of the passivation layer is formed by silicon oxide films, the second film layer is an alternate stack of silicon nitride films and silicon oxide films, and the thickness of the first film layer is greater than the thickness of the second film layer, hence, the silicon nitride films and the silicon oxide films in the second film layer are all relatively thin film layers, the silicon nitride films and the silicon oxide films in the second film layer make up for each other, which not only reduces adverse effect brought by longitudinal permeability of the silicon nitride film but also reduces adverse effect brought by low compactness of the silicon oxide film, thereby enabling the passivation layer to provide a better performance of preventing permeation of water, oxygen and hydrogen groups. Therefore, the active layer of the oxide TFT would not be influenced by the water, oxygen and hydrogen groups, thereby ensuring the performance of the oxide TFT.

According to an embodiment, a top layer of the second film layer away from the first film layer can be a silicon nitride film.

According to another embodiment, the thickness of each silicon nitride film in the second film layer can be equal, the thickness of each silicon oxide film in the second film layer can be equal, and the thickness of the silicon oxide film in the second film layer can be greater than or equal to the thickness of the silicon nitride film in the second film layer. In this embodiment, the thickness of respective silicon nitride films in the second film layer is uniform, the thickness of respective silicon oxide films in the second film layer is uniform, hence, it can provide stable performance of preventing permeation of water, oxygen and hydrogen groups.

According to a further embodiment, in the alternate stack of silicon nitride films and silicon oxide films of the second film layer, the thickness of respective films can decrease progressively from the base layer to the top layer. In this embodiment, the thickness of respective silicon nitride films and respective silicon oxide films in the second film layer decreases from the base layer to the top layer, thereby being capable of providing the performance of preventing permeation of water, oxygen and hydrogen groups better.

According to yet another embodiment, the thickness range of the first film layer can be 1500~4000 angstroms.

According to another embodiment, the thickness of each silicon oxide film in the second film layer can be 100~300 angstroms, the thickness of each silicon nitride film in the second film layer can be 100~300 angstroms. In this embodiment, the thickness of the silicon oxide film and the silicon nitride film of the second film layer is relatively thin, the alternate stack of the two can realize a relatively high compactness and a better longitudinal protection.

According to an embodiment, a sum of the thickness of respective silicon oxide films and respective silicon nitride films in the second film layer can be less than 1000 angstroms.

The beneficial effects of the first aspect of this disclosure include: the first film layer of the passivation layer above the oxide TFT is formed by silicon oxide films, the second film layer is an alternate stack of silicon nitride films and silicon oxide films, and the thickness of the first film layer is greater than the thickness of the second film layer, hence, the silicon nitride films and the silicon oxide films in the second film layer are all relatively thin film layers, and the silicon nitride films and the silicon oxide films in the second film layer make up for each other, which not only reduces adverse effect brought by longitudinal permeability of the silicon nitride film but also reduces adverse effect brought by low compactness of the silicon oxide film, thereby enabling the passivation layer to provide a better performance of preventing permeation of water, oxygen and hydrogen groups. Therefore, the active layer of the oxide TFT would not be influenced by the water, oxygen and hydrogen groups, thereby ensuring the performance of the oxide TFT and preventing failure of the oxide TFT.

A second aspect of this disclosure provides a display panel comprising the array substrate provided by the above embodiments.

The beneficial effects of the second aspect of this disclosure include: the array substrate of the display panel is provided with an oxide TFT, the first film layer of the passivation layer above the oxide TFT is formed by silicon oxide films, the second film layer is an alternate stack of silicon nitride films and silicon oxide films, and the thickness of the first film layer is greater than the thickness of the second film layer, hence, the silicon nitride films and the silicon oxide films in the second film layer are all relatively thin film layers, and the silicon nitride films and the silicon oxide films in the second film layer make up for each other, which not only reduces adverse effect brought by longitudinal permeability of the silicon nitride film but also reduces adverse effect brought by low compactness of the silicon oxide film, thereby enabling the passivation layer to provide a better performance of preventing permeation of water, oxygen and hydrogen groups. Therefore, the active layer of the oxide TFT would not be influenced by the water, oxygen and hydrogen groups, thereby ensuring the performance of the oxide TFT and preventing failure of the oxide TFT.

A third aspect of this disclosure provides a display device comprising the display panel provided by the above embodiments.

The beneficial effects of the third aspect of this disclosure include: the array substrate of the display panel of the display device is provided with an oxide TFT, the first film layer of the passivation layer above the oxide TFT is formed by silicon oxide films, the second film layer is an alternate stack of silicon nitride films and silicon oxide films, and the thickness of the first film layer is greater than the thickness of the second film layer, hence, the silicon nitride films and the silicon oxide films in the second film layer are all relatively thin film layers, and the silicon nitride films and the silicon oxide films in the second film layer make up for each other, which not only reduces adverse effect brought by longitudinal permeability of the silicon nitride film but also reduces adverse effect brought by low compactness of the silicon oxide film, thereby enabling the passivation layer to provide a better performance of preventing permeation of water, oxygen and hydrogen groups. Therefore, the active layer of the oxide TFT would not be influenced by the water, oxygen and hydrogen groups, thereby ensuring the performance of the oxide TFT and preventing failure of the oxide TFT.

A fourth aspect of this disclosure provides a preparation method of an array substrate, comprising:

forming an oxide TFT on a base substrate;

forming a first film layer of a passivation layer above the oxide TFT, forming silicon nitride films and silicon oxide films alternately on the first film layer, an alternate stack of respective silicon nitride films and respective silicon oxide films formed alternately serving as a second film layer, a base layer of the second film layer close to the first film layer being a silicon nitride film; wherein the thickness of the first film layer is greater than the thickness of the second film layer.

According to an embodiment, the first film layer can be a silicon oxide film.

According to an embodiment, a top layer of the second film layer away from the first film layer can be a silicon nitride film.

According to another embodiment, forming silicon nitride films and silicon oxide films alternately on the first film layer may comprise:

forming respective silicon nitride films and respective silicon oxide films in the second film layer alternately with predefined thickness; wherein the thickness of each silicon nitride film in the second film layer is equal, the thickness of each silicon oxide film in the second film layer is equal, and the thickness of the silicon oxide film in the second film layer is greater than or equal to the thickness of the silicon nitride film in the second film layer.

According to a further embodiment, forming silicon nitride films and silicon oxide films alternately on the first film layer may comprise:

forming respective silicon nitride films and respective silicon oxide films in the second film layer alternately with decreasing thickness from the base layer to the top layer of the second film layer.

According to yet another embodiment, the thickness range of the first film layer may be 1500~4000 angstroms.

According to an additional embodiment, the thickness of each silicon oxide film in the second film layer may be 100~300 angstroms, the thickness of each silicon nitride in the second film layer may be 100~300 angstroms.

According to an embodiment, a sum of the thickness of respective silicon oxide films and respective silicon nitride films in the second film layer can be less than 1000 angstroms.

The beneficial effects of the fourth aspect of this disclosure include: the first film layer of the passivation layer above the oxide TFT of the array substrate is formed by silicon oxide films, the second film layer is an alternate stack of silicon nitride films and silicon oxide films, and the thickness of the first film layer is greater than the thickness of the second film layer, hence, the silicon nitride films and the silicon oxide films in the second film layer are all relatively thin film layers, and the silicon nitride films and the silicon oxide films in the second film layer make up for each other, which not only reduces adverse effect brought by longitudinal permeability of the silicon nitride film but also reduces adverse effect brought by low compactness of the silicon oxide film, thereby enabling the passivation layer to provide a better performance of preventing permeation of water, oxygen and hydrogen groups. Therefore, the active layer of the oxide TFT would not be influenced by the water, oxygen and hydrogen groups, thereby ensuring the performance of the oxide TFT and preventing failure of the oxide TFT.

DETAILED DESCRIPTION

In the following, the implementing process of the embodiments of this disclosure will be explained in detail with reference to the drawings. It needs to be noted that the same or similar signs represent the same or similar components or components with the same or similar functions throughout. The embodiments below described by making reference to the drawings are exemplary, which are only used for explaining this disclosure while should not be understood as limitations to this disclosure.

Figure 1:
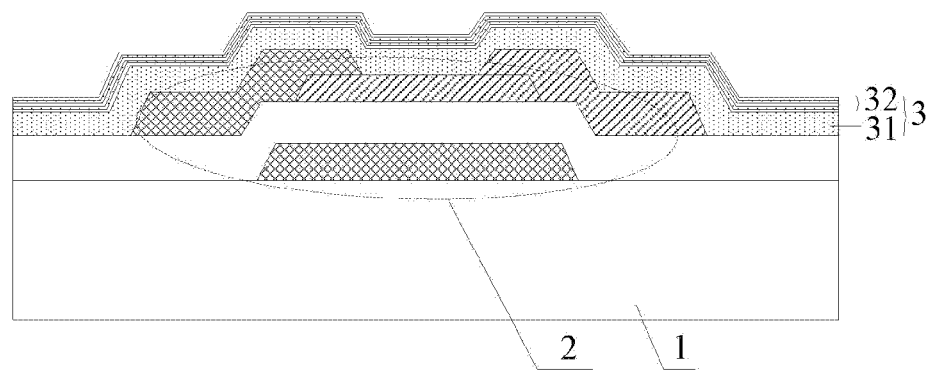
FIG. 1 is a sectional schematic view of an array substrate provided by an embodiment of this disclosure at the oxide TFT.

Referring to FIG. 1, the embodiment of this disclosure provides an array substrate, comprising a base substrate 1, an oxide thin film transistor TFT 2 formed on the base substrate 1, a passivation layer 3 being arranged above the oxide TFT 2, wherein the passivation layer 3 comprises a first film layer 31, the first film layer is a silicon oxide film;

the passivation layer 3 further comprises a second film layer 32 formed on the first film layer 31, the second film layer 32 is an alternate stack of silicon nitride films and silicon oxide films, a base layer of the second film layer 32 close to the first film layer 31 is a silicon nitride film;

wherein the thickness of the first film layer 31 is greater than the thickness of the second film layer 32.

In this embodiment, the first film layer of the passivation layer is formed by silicon oxide films, the second film layer is an alternate stack of silicon nitride films and silicon oxide films, and the thickness of the first film layer is greater than the thickness of the second film layer, hence, the silicon nitride films and the silicon oxide films in the second film layer are all relatively thin film layers, and the silicon nitride films and the silicon oxide films in the second film layer make up for each other, which not only reduces adverse effect brought by longitudinal permeability of the silicon nitride film but also reduces adverse effect brought by low compactness of the silicon oxide film, thereby enabling the passivation layer to provide a better performance of preventing permeation of water, oxygen and hydrogen groups. Therefore, the active layer of the oxide TFT would not be influenced by the water, oxygen and hydrogen groups, thereby ensuring the performance of the oxide TFT.

Figure 2:
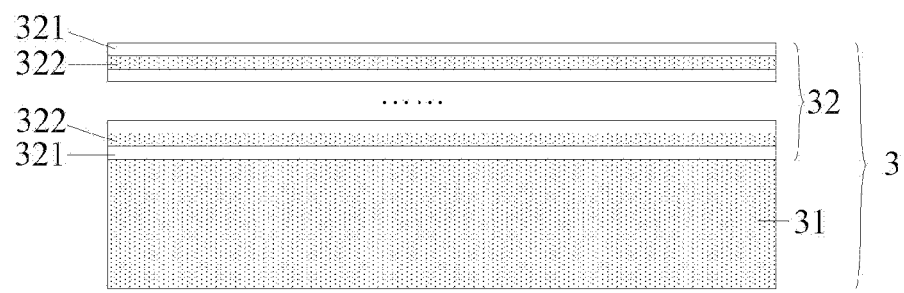
FIG. 2 is a partial sectional schematic view of a first passivation layer provided by an embodiment of the present invention.
Figure 3:
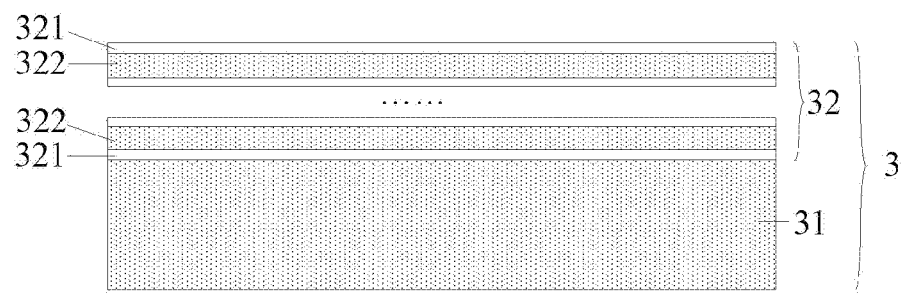
FIG. 3 is a partial sectional schematic view of a second passivation layer provided by an embodiment of the present invention.
Figure 4:
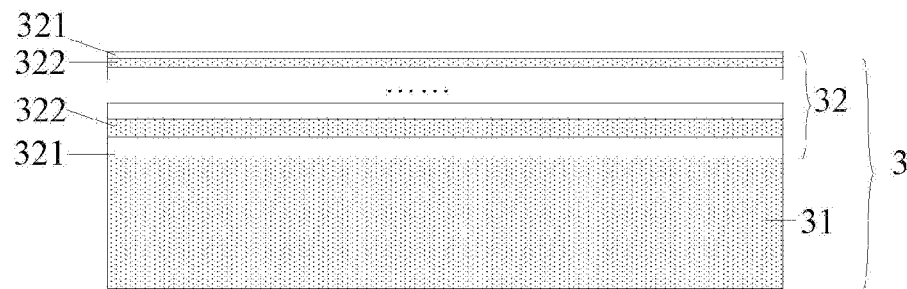
FIG. 4 is a partial sectional schematic view of a third passivation layer provided by an embodiment of the present invention.

In order to describe the structure of the passivation layer 3 more clearly, with the partial sectional schematic view of the passivation layer 3 as shown in FIG. 2 to FIG. 4, explanations are made as follows:

Referring to FIG. 2, in one embodiment, the second film layer 32 is an alternate stack of silicon nitride films 321 and silicon oxide films 322, a base layer of the second film layer 32 close to the first film layer 31 is a silicon nitride film 321. In the second film layer 32 as shown in FIG. 2, the thickness of each silicon nitride film 321 is equal, the thickness of each silicon oxide film 322 is equal, and the thickness of the silicon oxide film 322 is equal to the thickness of the silicon nitride film 321. In this embodiment, the thickness of respective silicon nitride films 321 and respective silicon oxide films 322 in the second film layer 32 is uniform, thus it can provide stable performance of preventing permeation of water, oxygen and hydrogen groups.

Referring to FIG. 3, in another embodiment, the second film layer 32 is an alternate stack of silicon nitride films 321 and silicon oxide films 322, a base layer of the second film layer 32 close to the first film layer 31 is a silicon nitride film 321. In the second film layer 32 as shown in FIG. 3, the thickness of each silicon nitride film 321 is equal, the thickness of each silicon oxide film 322 is equal, and the thickness of the silicon oxide film 322 is greater than the thickness of the silicon nitride film 321. In this embodiment, the thickness of respective silicon nitride films 321 in the second film layer 32 is uniform, the thickness of respective silicon oxide films 322 is uniform, thus it can provide stable performance of preventing permeation of water, oxygen and hydrogen groups.

Referring to FIG. 4, in a further embodiment, the second film layer 32 is an alternate stack of silicon nitride films 321 and silicon oxide films 322, the thickness of respective films decreases progressively from the base layer to the top layer. In this embodiment, the thickness of respective silicon nitride films 321 and respective silicon oxide films 322 in the second film layer 32 decreases progressively from the base layer to the top layer, thus it can provide the performance of preventing permeation of water, oxygen and hydrogen groups better.

As shown in FIG. 2 to FIG. 4, a top layer of the second film layer 32 away from the first film layer is a silicon nitride film 321. However, the skilled person in the art would realize that in an alternative embodiment, the top layer of the second film layer 32 away from the first film layer can also be a silicon oxide film 322.

According to an example, the thickness range of the first film layer 31 can be 1500~4000 angstroms.

According to another example, the thickness of each silicon oxide film 322 in the second film layer 32 can be 100~300 angstroms, the thickness of each silicon nitride film 321 in the second film layer can be 100~300 angstroms. In this example, the thickness of the silicon oxide film 322 and the silicon nitride film 321 of the second film layer 32 is relatively small, the alternate stack of the two can realize high compactness and better longitudinal protection.

According to an example, a sum of the thickness of respective silicon oxide films 322 and respective silicon nitride films 321 in the second film layer 32 can be less than 1000 angstroms.

In addition, the oxide TFT 2 generally comprises a gate, a gate insulating layer, an active layer, a source and a drain, moreover, the oxide TFT 2 can be a bottom gate structure (the oxide TFT 2 as shown in FIG. 1), or it can also be a top gate structure (not shown). Certainly, the oxide TFT 2 can also be other achievable structures; however, no matter what kind of structure the oxide TFT 2 is, the passivation layer thereon can adopt the passivation layer 3 provided by the embodiment of this disclosure, so as to achieve the effects of preventing permeation of water, oxygen and hydrogen groups, ensuring performance of the oxide TFT and preventing failure of the oxide TFT, which will not be repeated here.

Figure 5:
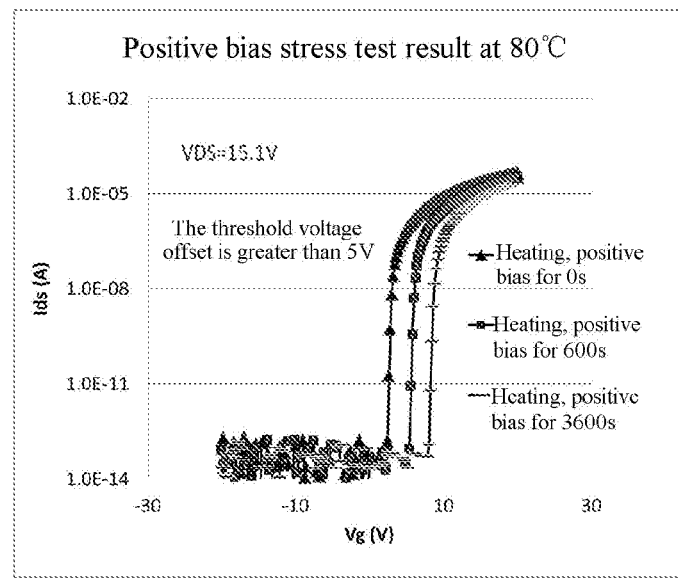
FIG. 5 is a schematic view of positive bias stability curve under heating of the oxide TFT of the prior art.
Figure 6:
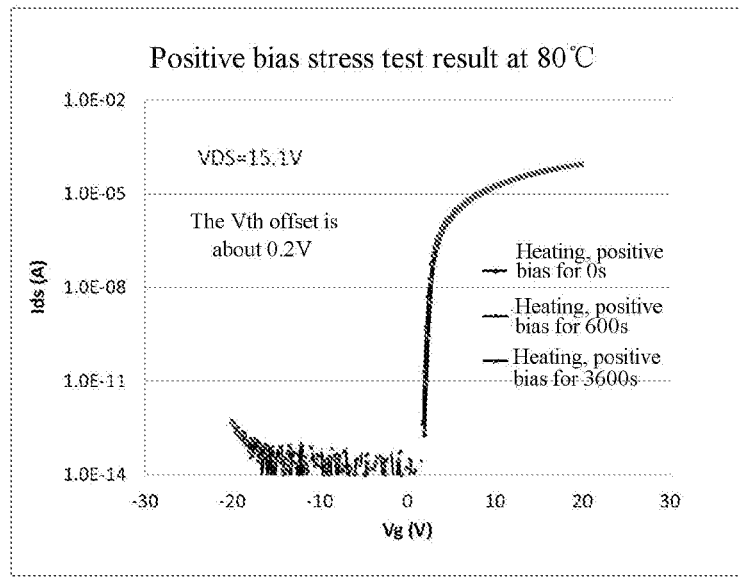
FIG. 6 is a schematic view of positive bias stability curve under heating of the oxide TFT provided by the embodiment of this disclosure above which the passivation layer as shown in FIG. 2 to FIG. 4 is arranged.

FIG. 5 shows a positive bias stability test curve of an oxide TFT with a passivation layer of the prior art structure. FIG. 6 shows a positive bias stability test curve of an oxide TFT using the passivation layer (the passivation layer 3 as shown in FIG. 2 to FIG. 4) in this disclosure. In the case that the test condition is at a temperature of 80 Celsius degrees, when the positive bias Vg is 20V, the transfer characteristic curves of the oxide TFT in the case of the stress time being 0 s, 100 s, 600 s, 1200 s, 3600 s are tested respectively, and the change of the threshold voltage of the oxide TFT is observed, wherein the threshold voltage of the oxide TFT is denoted by Vth, the change value of the threshold voltage Vth of the oxide TFT is denoted by ΔVth. As for the oxide TFT with the passivation layer of the prior art structure as shown in FIG. 5, due to the influence of the water, oxygen, hydrogen groups to the active layer of the oxide TFT, when a stress is applied to the oxide TFT for a long time, a relatively large offset will occur to the threshold voltage Vth, i.e., ΔVth of the oxide TFT is relatively large. In contrast, as shown in FIG. 6, the ΔVth of the oxide TFT using the passivation layer in this disclosure is small significantly, hence, the stability is improved apparently, which is favorable for improving performance of the active display device.

The beneficial effects of the above embodiment include: the first film layer of the passivation layer above the oxide TFT is formed by silicon oxide films, the second film layer is an alternate stack of silicon nitride films and silicon oxide films, and the thickness of the first film layer is greater than the thickness of the second film layer, hence, the silicon nitride films and the silicon oxide films in the second film layer are all relatively thin film layers, and the silicon nitride films and the silicon oxide films in the second film layer make up for each other, which not only reduces adverse effect brought by longitudinal permeability of the silicon nitride film but also reduces adverse effect brought by low compactness of the silicon oxide film, thereby enabling the passivation layer to provide a better performance of preventing permeation of water, oxygen and hydrogen groups. Therefore, the active layer of the oxide TFT would not be influenced by the water, oxygen and hydrogen groups, thereby ensuring the performance of the oxide TFT and preventing failure of the oxide TFT.

Embodiments of this disclosure provide a display panel comprising the array substrate provided by the above embodiment.

The beneficial effects of the above embodiment include: the array substrate of the display panel is provided with an oxide TFT, the first film layer of the passivation layer above the oxide TFT is formed by silicon oxide films, the second film layer is an alternate stack of silicon nitride films and silicon oxide films, and the thickness of the first film layer is greater than the thickness of the second film layer, hence, the silicon nitride films and the silicon oxide films in the second film layer are all relatively thin film layers, and the silicon nitride films and the silicon oxide films in the second film layer make up for each other, which not only reduces adverse effect brought by longitudinal permeability of the silicon nitride film but also reduces adverse effect brought by low compactness of the silicon oxide film, thereby enabling the passivation layer to provide a better performance of preventing permeation of water, oxygen and hydrogen groups. Therefore, the active layer of the oxide TFT would not be influenced by the water, oxygen and hydrogen groups, thereby ensuring the performance of the oxide TFT and preventing failure of the oxide TFT.

The embodiment of this disclosure further provides a display device comprising the display panel provided by the above embodiment.

The beneficial effects of the embodiment of this disclosure include: the array substrate of the display panel of the display device is provided with an oxide TFT, the first film layer of the passivation layer above the oxide TFT is formed by silicon oxide films, the second film layer is an alternate stack of silicon nitride films and silicon oxide films, and the thickness of the first film layer is greater than the thickness of the second film layer, hence, the silicon nitride films and the silicon oxide films in the second film layer are all relatively thin film layers, and the silicon nitride films and the silicon oxide films in the second film layer make up for each other, which not only reduces adverse effect brought by longitudinal permeability of the silicon nitride film but also reduces adverse effect brought by low compactness of the silicon oxide film, thereby enabling the passivation layer to provide a better performance of preventing permeation of water, oxygen and hydrogen groups. Therefore, the active layer of the oxide TFT would not be influenced by the water, oxygen and hydrogen groups, thereby ensuring the performance of the oxide TFT and preventing failure of the oxide TFT.

Figure 7:
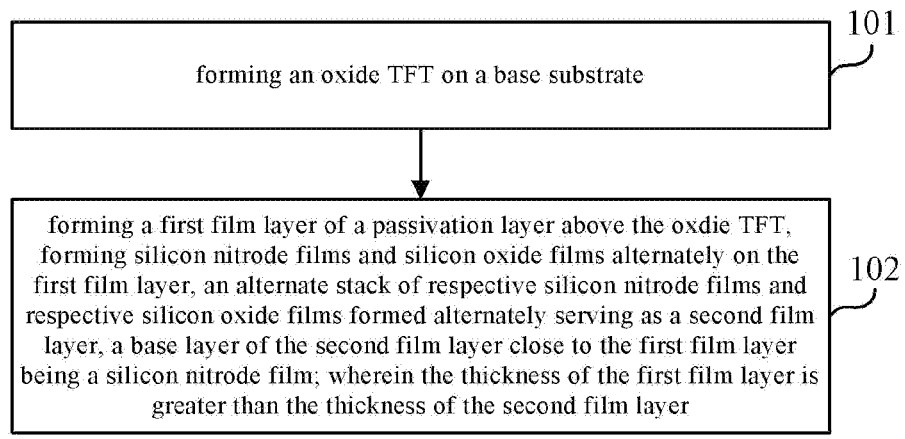
FIG. 7 is a flow chart of a preparation method of an array substrate provided by an embodiment of this disclosure.

Referring to FIG. 7, an embodiment of this disclosure provides a preparation method of an array substrate, comprising:

At 101, forming an oxide TFT on a base substrate.

At 102, forming a first film layer of a passivation layer above the oxide TFT, forming silicon nitride films and silicon oxide films alternately on the first film layer, an alternate stack of respective silicon nitride films and respective silicon oxide films formed alternately serving as a second film layer, a base layer of the second film layer close to the first film layer being a silicon nitride film; wherein the thickness of the first film layer is greater than the thickness of the second film layer.

According to an example, the first film layer can be a silicon oxide film.

According to an example, a top layer of the second film layer away from the first layer can be a silicon nitride film.

According to another example, forming silicon nitride films and silicon oxide films alternately on the first film layer comprises:

forming respective silicon nitride films and respective silicon oxide films in the second film layer alternately with predefined thickness; wherein the thickness of each silicon nitride film in the second film layer is equal, the thickness of each silicon oxide film in the second film layer is equal, and the thickness of the silicon oxide film in the second film layer is greater than or equal to the thickness of the silicon nitride film in the second film layer.

According to a further example, forming silicon nitride films and silicon oxide films alternately on the first film layer comprises:

forming respective silicon nitride films and respective silicon oxide films in the second film layer alternately with decreasing thickness from the base layer to the top layer of the second film layer.

According to yet another example, the thickness range of the first film layer can be 1500~4000 angstroms.

According to an additional example, the thickness of each silicon oxide film in the second film layer is 100~300 angstroms, the thickness of each silicon nitride in the second film layer is 100~300 angstroms.

According to an example, a sum of the thickness of respective silicon oxide films and respective silicon nitride films in the second film layer is less than 1000 angstroms, i.e., the whole thickness of the second film layer is less than 1000 angstroms.

The beneficial effects of the above embodiment include: the first film layer of the passivation layer above the oxide TFT of the array substrate is formed by silicon oxide films, the second film layer is an alternate stack of silicon nitride films and silicon oxide films, and the thickness of the first film layer is greater than the thickness of the second film layer, hence, the silicon nitride films and the silicon oxide films in the second film layer are all relatively thin film layers, and the silicon nitride films and the silicon oxide films in the second film layer make up for each other, which not only reduces adverse effect brought by longitudinal permeability of the silicon nitride film but also reduces adverse effect brought by low compactness of the silicon oxide film, thereby enabling the passivation layer to provide a better performance of preventing permeation of water, oxygen and hydrogen groups. Therefore, the active layer of the oxide TFT would not be influenced by the water, oxygen and hydrogen groups, thereby ensuring the performance of the oxide TFT and preventing failure of the oxide TFT.

Apparently, the skilled person in the art can make various modifications and variations to this disclosure without departing from the spirit and scope of this disclosure. In this way, provided that these modifications and variations of this disclosure belong to the scopes of the claims of this disclosure and the equivalent technologies thereof, this disclosure also intends to cover these modifications and variations.

The invention claimed is:

1. An array substrate comprising a base substrate, an oxide thin film transistor TFT formed on the base substrate, a passivation layer being arranged above the oxide TFT, wherein the passivation layer comprises a first film layer, the first film layer is a silicon oxide film;
   the passivation layer further comprises a second film layer formed on the first film layer, the second film layer is an alternate stack of silicon nitride films and silicon oxide films, a base layer of the second film layer close to the first film layer is a silicon nitride film;
   wherein the thickness of the first film layer is greater than the thickness of the second film layer,
   wherein, in the alternate stack of silicon nitride films and silicon oxide films in the second film layer, the thickness of each film decreases progressively from the base layer to the top layer.

2. The array substrate as claimed in claim 1, wherein a top layer of the second film layer away from the first film layer is a silicon nitride film.

3. The array substrate as claimed in claim 1, wherein the thickness range of the first film layer is 1500~4000 angstroms.

4. The array substrate as claimed in claim 1, wherein the thickness of each silicon oxide film in the second film layer is 100~300 angstroms, the thickness of each silicon nitride film in the second film layer is 100~300 angstroms.

5. The array substrate as claimed in claim 4, wherein a sum of the thickness of respective silicon oxide films and respective silicon nitride films in the second film layer is less than 1000 angstroms.

6. A display panel comprising an array substrate, the array substrate comprising a base substrate, an oxide thin film transistor TFT formed on the base substrate, a passivation layer being arranged above the oxide TFT, wherein the passivation layer comprises a first film layer, the first film layer is a silicon oxide film;
   the passivation layer further comprises a second film layer formed on the first film layer, the second film layer is an alternate stack of silicon nitride films and silicon oxide films, a base layer of the second film layer close to the first film layer is a silicon nitride film;
   wherein the thickness of the first film layer is greater than the thickness of the second film layer,
   wherein, in the alternate stack of silicon nitride films and silicon oxide films in the second film layer, the thickness of each film decreases progressively from the base layer to the top layer.

7. A display device comprising a display panel as claimed in claim 6.

8. A preparation method of an array substrate, comprising:
   forming an oxide TFT on a base substrate;
   forming a first film layer of a passivation layer above the oxide TFT, forming silicon nitride films and silicon oxide films alternately on the first film layer, an alternate stack of respective silicon nitride films and respective silicon oxide films formed alternately serving as a second film layer, a base layer of the second film layer close to the first film layer being a silicon nitride film;
   wherein the thickness of the first film layer is greater than the thickness of the second film layer,
   wherein forming silicon nitride films and silicon oxide films alternately on the first film layer comprises:
   forming respective silicon nitride films and respective silicon oxide films in the second film layer alternately with decreasing thickness from the base layer to the top layer of the second film layer.

9. The preparation method as claimed in claim 8, wherein the first film layer is a silicon oxide film.

10. The preparation method as claimed in claim 8, wherein a top layer of the second film layer away from the first film layer is a silicon nitride film.

11. The preparation method as claimed in claim 8, wherein the thickness range of the first film layer is 1500~4000 angstroms.

12. The preparation method as claimed in claim 8, wherein the thickness of each silicon oxide film in the second film layer is 100~300 angstroms, the thickness of each silicon nitride in the second film layer is 100~300 angstroms.

13. The preparation method as claimed in claim 12, wherein a sum of the thickness of respective silicon oxide films and respective silicon nitride films in the second film layer is less than 1000 angstroms.

14. The display panel as claimed in claim 6, wherein a top layer of the second film layer away from the first film layer is a silicon nitride film.

* * * * *